United States Patent
Zhao et al.

(10) Patent No.: US 9,859,331 B2
(45) Date of Patent: Jan. 2, 2018

(54) PREPARATION METHOD FOR HIGH-VOLTAGE LED DEVICE INTEGRATED WITH PATTERN ARRAY

(71) Applicant: DURA CHIP (SUZHOU) LTD., Jiangsu (CN)

(72) Inventors: Hongyue Zhao, Jiangsu (CN); Shihui Song, Jiangsu (CN); Zhijiang Sun, Jiangsu (CN)

(73) Assignee: Dura Chip (Suzhou) Ltd., Jiangsu (CN)

( * ) Notice: Subject to any disclaimer, the term of this patent is extended or adjusted under 35 U.S.C. 154(b) by 0 days.

(21) Appl. No.: 15/628,583

(22) Filed: Jun. 20, 2017

(65) Prior Publication Data
US 2017/0352699 A1    Dec. 7, 2017

Related U.S. Application Data

(63) Continuation of application No. 14/647,598, filed as application No. PCT/CN2012/084505 on Nov. 13, 2012, now Pat. No. 9,711,564.

(30) Foreign Application Priority Data

Sep. 29, 2012 (CN) .......................... 2012 1 0371058

(51) Int. Cl.
*H01L 27/12* (2006.01)
*H01L 27/15* (2006.01)
(Continued)

(52) U.S. Cl.
CPC ........ *H01L 27/156* (2013.01); *H01L 33/0075* (2013.01); *H01L 33/08* (2013.01);
(Continued)

(58) Field of Classification Search
None
See application file for complete search history.

(56) References Cited

U.S. PATENT DOCUMENTS 9,711,564 B2 *  7/2017  Zhao ..................... H01L 27/156

* cited by examiner

*Primary Examiner* — Michael Lebentritt
(74) *Attorney, Agent, or Firm* — Vidas, Arrett & Steinkraus

(57) ABSTRACT

The invention disclosed a preparation method for a high-voltage LED device integrated with a pattern array, comprising the following process steps: providing a substrate, and forming a N-type GaN limiting layer, an epitaxial light-emitting layer and a P-type GaN limiting layer on the substrate in sequence; isolating the N-GaN limiting layer, the epitaxial light-emitting layer and the P-GaN limiting layer on the substrate into at least two or more independent pattern units by means of photo lithography and etching process, wherein each of the pattern unit is in a triangular shape, and very two adjacent pattern units are arranged in an opposing and crossed manner to form a quadrangle, and the quadrangles formed by a plurality of adjacent pattern units are distributed in array; and connecting each pattern unit with metal wires to form a series connection and/or a parallel connection, thereby forming a plurality of interconnected LED chips. For the purpose of improving the current distribution so as to increase the luminescent efficiency of the device, a current blocking layer is also arranged beneath the P-type metal contact of each unit; in addition, an insulation material is also arranged to cover the surface of the chip so as to achieve the purposes of protecting the chip and increasing the light extraction efficiency of the chip.

8 Claims, 1 Drawing Sheet

(51) Int. Cl.
  *H01L 33/00*  (2010.01)
  *H01L 33/20*  (2010.01)
  *H01L 33/14*  (2010.01)
  *H01L 33/08*  (2010.01)
  *H01L 33/62*  (2010.01)

(52) U.S. Cl.
  CPC ............ *H01L 33/145* (2013.01); *H01L 33/20* (2013.01); *H01L 33/62* (2013.01); *H01L 2924/00* (2013.01); *H01L 2924/0002* (2013.01); *H01L 2933/0016* (2013.01); *H01L 2933/0025* (2013.01); *H01L 2933/0066* (2013.01)

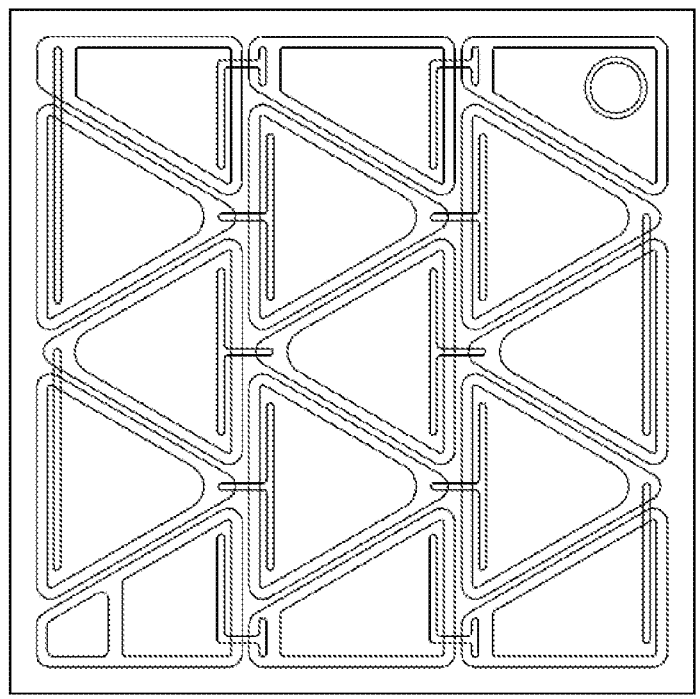

PREPARATION METHOD FOR HIGH-VOLTAGE LED DEVICE INTEGRATED WITH PATTERN ARRAY

FIELD OF THE INVENTION

The present invention relates to the field of optical electronic device manufacturing, in particular to a design and preparation method for a high-voltage LED device integrated with a pattern array.

BACKGROUND OF THE INVENTION

With the rise of the third generation semiconductor materials starting with the breakthrough of p-type doped GaN (gallium nitride) material, accompanied by the technology breakthrough of the high-luminance LED (Light Emitting Diode, LED) based on group III nitride, the nitride based LED for a new generation of solid state lighting source that is green and environmental protective is becoming a new research hotspot. Group III nitride semiconductors, mainly based on GaN (gallium nitride), InGaN (indium gallium nitride), and AlGaN (aluminum gallium nitride) that are ideal materials for manufacturing high-luminance light emitting device, are provided with many excellent features such as wide direct band gap, high internal and external quantum efficiency, high thermal conductivity, good temperature resistance, good corrosion resistance, good shock resistance, and high strength and hardness, etc.

Currently, with the continuous upgrade on the LED application and the market demand of the LED, the LED technology is evolving towards to high power and high luminance. However, as the rapid development of high-power LED lighting industry, often several or dozens, even hundreds of LEDs are connected in series or in parallel in order to prepare a high-voltage LED device. The structure of this kind of high-voltage LED device is provided with too many bonding wires, too much cost and too large area, also a crowding effect of the current density is prone to take place regionally because of auger recombination under a large circuit condition, causing the photosynthetic efficiency of LED declines linearly. While under the same output power, the high-voltage LED device need less driving current than the low-voltage LED does, but exhibits higher photosynthetic efficiency. In view of this, it is necessary to find other new design, new process and new project for the high-voltage LED preparation.

SUMMARY OF THE INVENTION

The object of the invention is to solve the above problems, wherein integrated graphics manufacturing can be made directly on the substrate of the LED chip during the group III nitride based high-voltage LED device is fabricated, and an optimized design for the internal graphics of each pattern, the combination of the graphics, and the connection between them is applied to prepare high-voltage LED.

In order to obtain one or more of these objects, the present invention provides a preparation method for a high-voltage LED device integrated with a pattern array comprises the following process steps:

a) providing a substrate, and forming a N-GaN limiting layer, an epitaxial light-emitting layer and a P-GaN limiting layer on the substrate in sequence;

b) isolating the N-GaN limiting layer, the epitaxial light-emitting layer and the P-GaN limiting layer on the substrate into at least two or more independent pattern units by means of photo lithography and etching process, wherein each of the pattern unit is in a triangular shape, and a plurality of the pattern units are distributed in array and constituted a quadrangle as a whole;

c) connecting each pattern unit with conductive materials to form a series connection and/or a parallel connection, thereby forming a plurality of interconnected LED chips.

Preferably, an insulation material is arranged to cover the surface of the chip to protect the chip and increase the light extraction efficiency thereof.

Preferably, wherein, the insulation material is filled into the trench that etched to the substrate to serve as a mask to protect the profile of the GaN from current leakage, and patterns are prepared as the mask by photo lithography, then the insulation material except from that in the trench is removed with chemical or physical methods to emerge the GaN for the next steps.

Preferably, an insulation material is arranged to cover the surface of the chip, and patterns are prepared as the mask by photo lithography, while the chip except from the wire pad is protected to reduce the leakage current resulted from the extraneous matter and increase the luminescent efficiency according to the transmission principle.

Preferably, an insulation layer is prepared, and patterns are prepared as the mask by photo lithography, then the unnecessary part of the insulation layer is removed with chemical or physical methods to improve the P/N electrode current distribution of the chip and increase the luminescent efficiency thereof.

Preferably, for the purpose of improving the current distribution so as to increase the light-emitting efficiency of the chip, a current blocking layer is arranged beneath the P-electrode of each unit.

Preferably, patterns are prepared as the mask by photo lithography, and the initial shape of pattern unit is formed with inductively coupled plasma etching equipment and/or strong acid corrosion, then the GaN layer without mask is etched to the substrate layer to realize the disconnection of each unit.

Preferably, patterns are prepared as the mask by photo lithography, and the P-GaN is etched to the N-GaN with inductively coupled plasma etching equipment to provide each unit a P/N electrode for connection.

Preferably, patterns are prepared as the mask by photo lithography, and the metal wire pads are prepared with evaporation or sputtering equipment so that all units are connected via a series and/or a parallel connection.

Preferably, a transparent electrode layer, which can be any material provided with high-light transmittance and good electro-conductibility, is prepared with evaporation or sputtering equipment, and patterns are prepared as the mask by photo lithography, then the transparent electrode layer of the pattern unit is removed with chemical or physical methods to increase the current diffusivity and light transmittance.

By adopting the technical scheme, the present invention has the advantages that the structure according to the invention is greatly optimized for the high-voltage LED application field.

BRIEF DESCRIPTION OF THE DRAWINGS

FIG. 1 shows a schematic view of the preferred embodiment of the preparation method for a high-voltage LED device integrated with a pattern array according to the invention.

DETAILED DESCRIPTION OF THE PREFERRED EMBODIMENTS

The detailed description of the preferred embodiment according to the invention is given as below with the accompanying drawings so that the benefits and features of the present invention are understood for those skilled in the art.

As shown in FIG. 1, the preparation method for a high-voltage LED device integrated with a pattern array of the preferred embodiment comprises the following process steps:

a) providing a substrate, and forming a N-GaN limiting layer, an epitaxial light-emitting layer and a P-GaN limiting layer on the substrate in sequence;
b) isolating the N-GaN limiting layer, the epitaxial light-emitting layer and the P-GaN limiting layer on the substrate into at least two or more independent pattern units by means of photo lithography and etching process, wherein each of the pattern unit is in a triangular shape, and every two adjacent pattern units are arranged in an opposing and crossed manner to form a quadrangle, and a plurality of adjacent pattern units are distributed in array and constituted a quadrangle as a whole;
c) connecting each pattern unit with metal wire to form a series connection and/or a parallel connection, thereby forming a plurality of interconnected LED chips.

It is to be noted that in this preferred embodiment, every two adjacent pattern units are arranged in an opposing and crossed manner to form a quadrangle, and the quadrangles formed by a plurality of adjacent pattern units are distributed in array and constituted a bigger sized quadrangle. The connection circuit of the device is in an S shape serially connecting the LED chips of each row, which is electrically coupled to the external circuit with the electrodes at the upper right corner and the lower left corner. The connection of this embodiment is merely illustrative of specific ways to make and use the invention, while other like connections are not listed. In addition, the specific parameter of the pattern unit triangle and the way of the arrangement of the quadrangle array are not described in details, which can be varied under the spiritual essence of the present invention.

As a further improvement, an insulation material is arranged to cover the surface of the chip to protect the chip and increase the light extraction efficiency thereof. The insulation material is filled into the trench that etched to the substrate to serve as a mask to protect the profile of the GaN from current leakage, and patterns are prepared as the mask by photo lithography, then the insulation material except from that in the trench is removed with chemical or physical methods to emerge the GaN for the next steps. An insulation material is arranged to cover the surface of the chip, and patterns are prepared as the mask by photo lithography, while the chip except from the wire pad is protected to reduce the leakage current resulted from the extraneous matter and increase the light extraction efficiency according to the transmission principle.

Moreover, an insulation layer is prepared, and patterns are prepared as the mask by photo lithography, then the unnecessary part of the insulation layer is removed with chemical or physical methods to improve the P/N electrode current distribution of the chip and increase the luminescent efficiency thereof.

As a further improvement, for the purpose of improving the current distribution so as to increase the luminescent efficiency of the chip, a current blocking layer is arranged beneath the P-electrode of each unit.

As a further improvement, patterns are prepared as the mask by photo lithography, and the initial shape of pattern unit is formed with inductively coupled plasma etching equipment and/or strong acid corrosion, then the GaN layer without mask is etched to the substrate layer to realize the disconnection of each unit.

As a further improvement, patterns are prepared as the mask by photo lithography, and the P-GaN is etched to the N-GaN with inductively coupled plasma etching equipment to provide each unit a P/N electrode for connection.

As a further improvement, patterns are prepared as the mask by photo lithography, and the metal wire pads are prepared with evaporation or sputtering equipment so that all units are connected via a series and/or a parallel connection.

As a further improvement, a transparent electrode layer, which can be any material provided with high-light transmittance and good electro-conductibility, is prepared with evaporation or sputtering equipment, and patterns are prepared as the mask by photo lithography, then the transparent electrode layer of the pattern unit is removed with chemical or physical methods to increase the current diffusivity and light transmittance.

The above descriptions are meant to be exemplary only and are not limited to the examples shown in the drawings and described hereinbefore, and those skilled in the art will recognize that changes may be made to the embodiments described without department from the scope of the invention disclosed. Still other modifications varied in efficient manners within the scope of the present invention and their technical equivalents will be apparent to those skilled in the art, in light of a review of this disclosure, and such modifications are intended to fall within the appended claims.

The invention claimed is:

1. A high-voltage LED device comprising: a substrate; a N-GaN limiting layer, an epitaxial light-emitting layer and a P-GaN limiting layer arranged in a plurality of pattern units, the pattern units comprising a first row of pattern units and a second row of pattern units, wherein each pattern unit in the first row comprises a triangular shape having a similar orientation, each pattern unit in the second row comprises a similar shape having a similar orientation, the first row occupying a first width dimension upon the substrate, the second row occupying a second width dimension upon the substrate, the first width dimension overlapping the second width dimension, the plurality of the pattern units arranged as a quadrangle; and a plurality of conductors connecting the pattern units.

2. The high-voltage LED device of claim 1, comprising an insulation material arranged to cover a surface of the device.

3. The high-voltage LED device of claim 2, the insulation material positioned in a trench.

4. The high-voltage LED device of claim 2, the plurality of conductors forming a series connection between the plurality of pattern units.

5. The high-voltage LED device of claim 2, the plurality of conductors forming a parallel connection between the plurality of pattern units.

6. The high-voltage LED device of claim 1, comprising a current blocking layer arranged beneath a P-electrode of each pattern unit.

7. The high-voltage LED device of claim 1, comprising a transparent electrode layer.

8. The high-voltage LED device of claim 1, wherein each pattern unit in the second row comprises a 4-sided shape.

\* \* \* \* \*